(12) United States Patent
Hasnine et al.

(10) Patent No.: US 12,733,519 B2
(45) Date of Patent: Sep. 8, 2026

(54) MULTICHIP MODULE THERMAL MANAGEMENT THROUGH BACKSIDE METAL

(71) Applicant: Qorvo US, Inc., Greensboro, NC (US)

(72) Inventors: MD Hasnine, Richardson, TX (US); Mark C. Woods, Richardson, TX (US); Neftali Salazar, Oak Ridge, NC (US); Smreeti Dahariya, Chapel Hill, NC (US); Christine Blair, Lewisville, TX (US)

(73) Assignee: Qorvo US, Inc., Greensboro, NC (US)

( * ) Notice: Subject to any disclaimer, the term of this patent is extended or adjusted under 35 U.S.C. 154(b) by 468 days.

(21) Appl. No.: 18/125,996

(22) Filed: Mar. 24, 2023

(65) Prior Publication Data

US 2023/0343721 A1 Oct. 26, 2023

Related U.S. Application Data

(60) Provisional application No. 63/363,279, filed on Apr. 20, 2022.

(51) Int. Cl.
*H10W 70/60* (2026.01)
*H10W 70/02* (2026.01)
(Continued)

(52) U.S. Cl.
CPC ......... *H10W 70/614* (2026.01); *H10W 70/02* (2026.01); *H10W 74/016* (2026.01);
(Continued)

(58) Field of Classification Search
CPC ............. H01L 23/5389; H01L 21/4871; H01L 21/565; H01L 23/3121; H01L 24/48;
(Continued)

(56) References Cited

U.S. PATENT DOCUMENTS 7,187,077 B1 3/2007 Nagarajan
9,899,292 B2 2/2018 Chiu et al.
(Continued)

OTHER PUBLICATIONS

Galloway, J. et al., "Thermal performance of FCMBGA: Exposed molded die compared to lidded package," 2011 27th Annual IEEE Semiconductor Thermal Measurement and Management Symposium, Mar. 20-24, 2011, San Jose, CA, USA, IEEE, 6 pages.
(Continued)

*Primary Examiner* — Elias Ullah
(74) *Attorney, Agent, or Firm* — Withrow & Terranova, P.L.L.C.

(57) ABSTRACT

Multichip module thermal management through backside metal systems and methods are disclosed. In one aspect, a multichip module includes one or more flip chip integrated circuits (ICs), each having a backside to which a metal heat conductor or spreader is attached. The presence of the metal heat conductor on the backside of the flip chip ICs allows for a better thermal path to remove heat from the ICs relative to the substrate. The improved thermal path reduces the likelihood of damage to the ICs or delamination of the module. A variety of methods are proposed to construct the backside metal systems. Additionally, a variety of capture features may be used to assist in structural integrity.

19 Claims, 13 Drawing Sheets

(51) Int. Cl.
*H10W 74/01* (2026.01)
*H10W 74/10* (2026.01)
*H10W 90/00* (2026.01)

(52) U.S. Cl.
CPC .......... *H10W 74/114* (2026.01); *H10W 90/00* (2026.01); *H10W 74/142* (2026.01); *H10W 90/755* (2026.01)

(58) Field of Classification Search
CPC ....... H01L 25/0655; H01L 2224/48177; H01L 2924/18161; H01L 2224/73204; H01L 21/56; H01L 23/4334
See application file for complete search history.

(56) References Cited

U.S. PATENT DOCUMENTS

2005/0077614 A1 4/2005 Chengalva et al.
2007/0045812 A1 3/2007 Heng
2007/0108634 A1 5/2007 Higashi et al.
2009/0283900 A1 11/2009 Yamada
2015/0146399 A1 5/2015 Viswanathan et al.
2017/0263515 A1 9/2017 Bolognia et al.
2019/0311963 A1 10/2019 Christianson et al.
2020/0304920 A1 9/2020 Achehboune et al.
2021/0050650 A1 2/2021 Chiu et al.
2022/0324231 A1 10/2022 Koike et al.
2023/0063692 A1* 3/2023 Wang ...................... H01L 24/14
2023/0178467 A1 6/2023 Meliane et al.
2023/0209789 A1 6/2023 Saito et al.

OTHER PUBLICATIONS

Islam, N. et al., “Backside Metallization for Low Cost High Thermal Package,” 2006 56th IEEE Electronic Components and Technology Conference (ECTC 2006), retrieved Jul. 12, 2022 from https://www.semiconductorpackagingnews.com/uploads/1/Backside_metalization_for_high_thermal_and_low_cost_package_IMAPS_DPC2020_extended_abstract.pdf, 4 pages.

Sure, G. et al., “Evaluation and Characterization of Molded flip-chip BGA Package for 28nm FPGA Applications,” IPC Apex Expo Conference Proceedings, Feb. 2012, retrieved Jul. 12, 2022 from http://www.circuitinsight.com/pdf/evaluation_characterization_molded_flip_chip_ipc.pdf, 9 pages.

Non-Final Office Action for U.S. Appl. No. 17/657,185, mailed Jun. 18, 2024, 13 pages.

Final Office Action for U.S. Appl. No. 17/657,185, mailed Sep. 6, 2024, 17 pages.

Applicant-Initiated Interview Summary for U.S. Appl. No. 17/657,185, mailed Oct. 30, 2024, 4 pages.

* cited by examiner

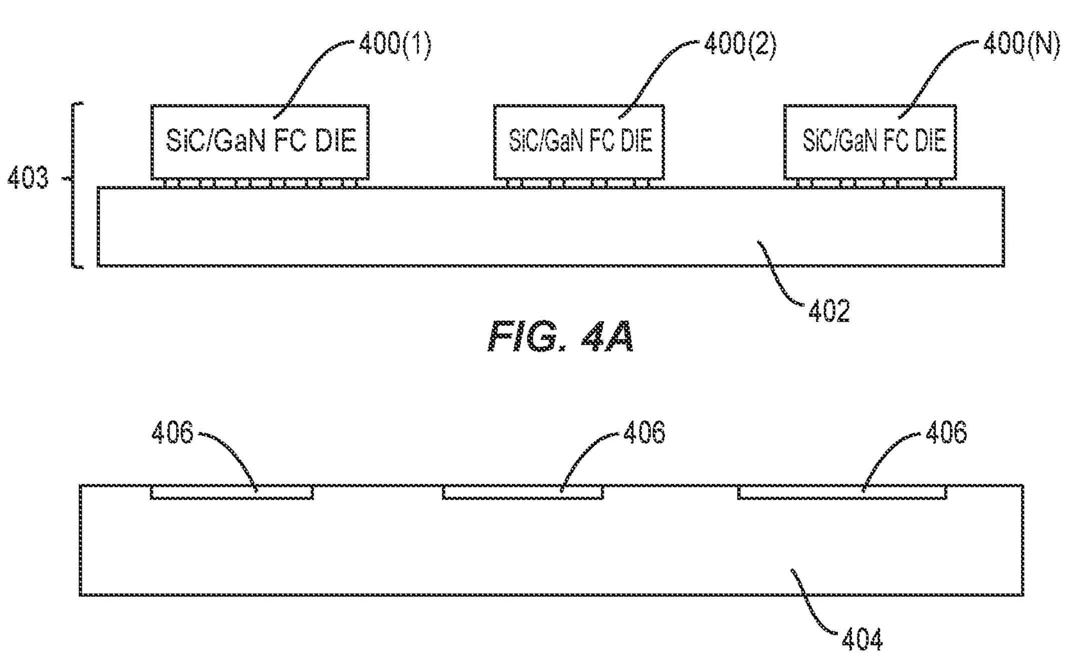
FIG. 4A
406
406
406
404
FIG. 4B
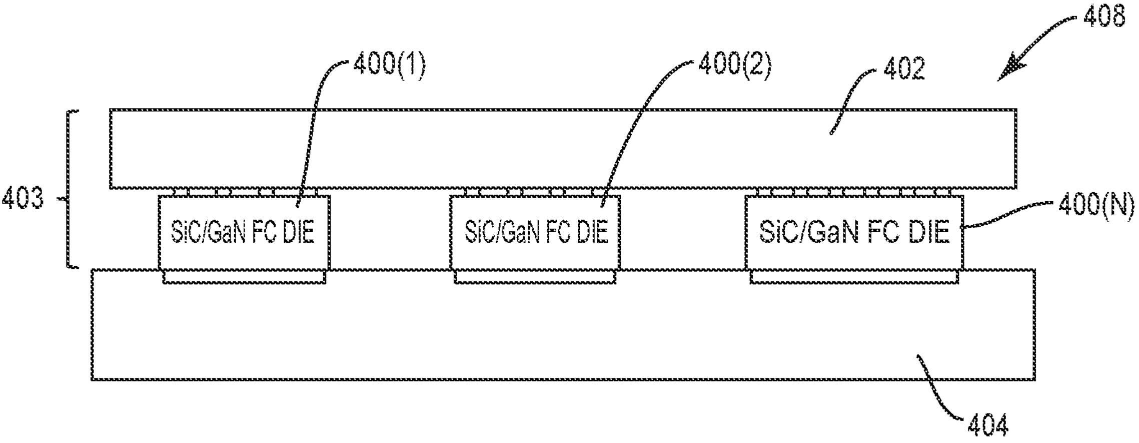
FIG. 4C
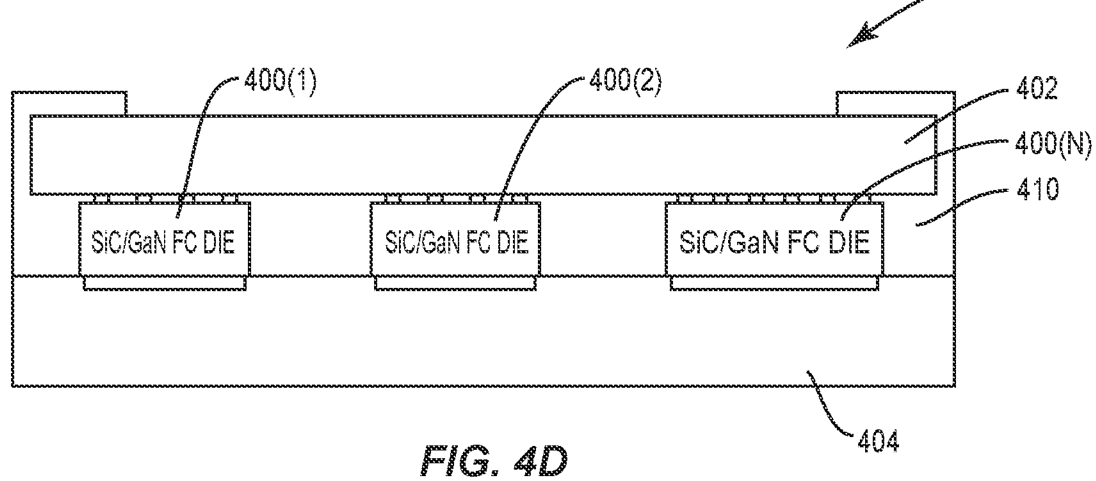
FIG. 4D

MULTICHIP MODULE THERMAL MANAGEMENT THROUGH BACKSIDE METAL

PRIORITY CLAIM

The present application claims priority to U.S. Provisional Patent Application Ser. No. 63/363,279 filed on Apr. 20, 2022, and entitled "MULTICHIP MODULE THERMAL MANAGEMENT THROUGH BACKSIDE METAL," the contents of which are incorporated herein by reference in its entirety.

BACKGROUND

I. Field of the Disclosure

The technology of the disclosure relates generally to heat dissipation in a multichip module.

II. Background

Computing devices abound in modern society. The prevalence of these devices is driven in part by the many functions that are now enabled on such devices. Increased processing capabilities in such devices mean that devices have evolved from simple calculation devices and communication tools into sophisticated multi-function processing devices, thus enabling advanced computational activities, which, when used in cellular systems, may provide enhanced user experiences. Similarly, industries with heavy computational requirements, such as the automotive (particularly electric vehicles) and defense industries, have embraced computing devices. With the advent of the myriad functions available to such devices, there has been increased power consumption within the device, which, in turn, generates increased heat, which must find a way to be dissipated before the heat damages circuitry within the devices. Accordingly, there is room for innovation in ways to dissipate heat.

SUMMARY

Aspects disclosed in the detailed description include multichip module thermal management through backside metal systems and methods. In an exemplary aspect, a multichip module includes one or more flip chip integrated circuits (ICs), each having a backside to which a metal heat conductor or spreader is attached. The presence of the metal heat conductor on the backside of the flip chip ICs allows for a better thermal path to remove heat from the ICs relative to the substrate. The improved thermal path reduces the likelihood of damage to the ICs or delamination of the module. Various methods are proposed to construct the backside metal systems of the present disclosure. Additionally, various capture features may be used to assist in structural integrity.

In this regard, in one aspect, a multichip module is disclosed. The multichip module comprises a substrate. The multichip module also comprises a plurality of chips coupled to the substrate. The multichip module also comprises a continuous heat spreader thermally coupled to each of the plurality of chips.

In another aspect, a method of forming a multichip module is disclosed. The method comprises forming a plurality of chips. The method also comprises a flip chip attaching the plurality of chips to a substrate. The method also comprises forming a heat spreader with a plurality of cavities corresponding to the plurality of chips. The method also comprises attaching the plurality of chips to the heat spreader.

In another aspect, a method of forming a multichip module is disclosed. The method comprises forming a heat spreader with a plurality of cavities. The method also comprises dispensing a high thermal sintered material into the plurality of cavities. The method also comprises attaching a plurality of chips to the heat spreader at the plurality of cavities. The method also comprises attaching the plurality of chips to a laminate.

BRIEF DESCRIPTION OF THE DRAWINGS

FIGS. 4A-4D are side elevational views of intermediate and finished products corresponding to the process of FIG. 3;

FIGS. 6A-6E are side elevational views of intermediate and finished products corresponding to the process of FIG. 5;

DETAILED DESCRIPTION

Figure 1:
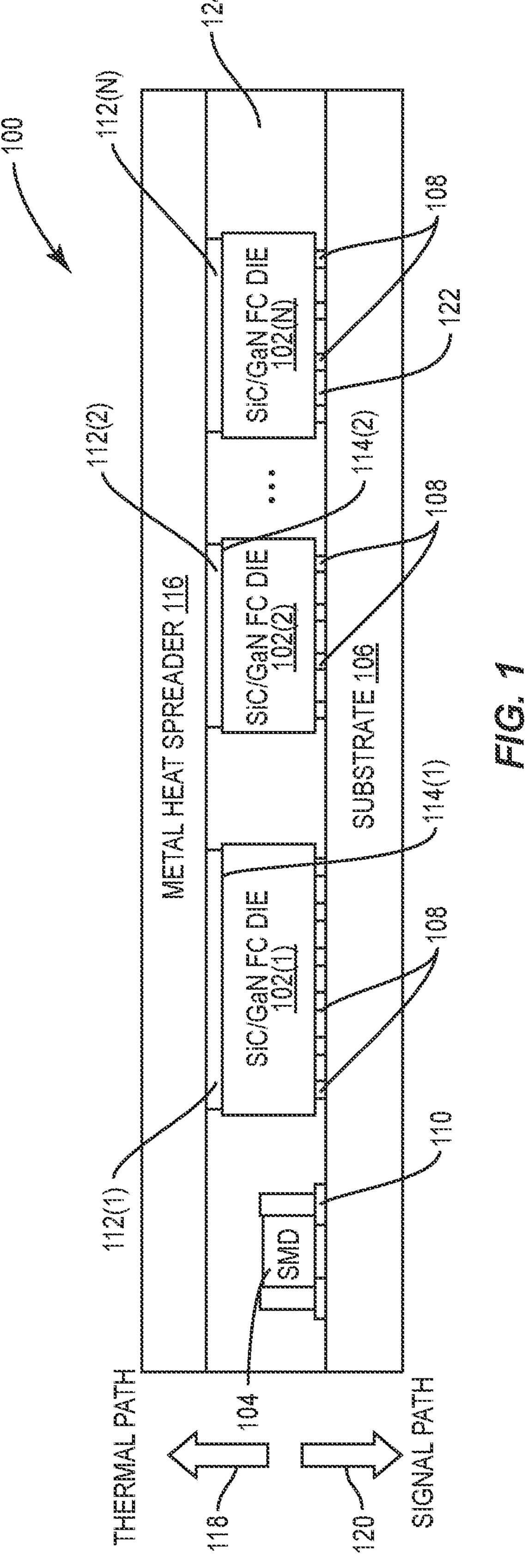
FIG. 1 is a cross-sectional side elevational view of a multichip module having a continuous backside metal system attached thereto.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, no intervening elements are present when an element is referred to as being "directly on" or extending "directly onto" another element. Likewise, it will be understood that when an element such as a layer, region, or substrate is referred to as being "over" or extending "over" another element, it can be directly over or extend directly over the other element, or intervening elements may also be present. In contrast, no intervening elements are present when an element is referred to as being "directly over" or extending "directly over" another element. It will also be understood that when an element is referred to as being "connected" or "coupled" to another element, it can be directly connected or coupled to the other element, or intervening elements may be present. In contrast, no intervening elements are present when an element is referred to as being "directly connected" or "directly coupled" to another element.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include multichip module thermal management through backside metal systems and methods. In an exemplary aspect, a multichip module includes one or more flip chip integrated circuits (ICs), each having a backside to which a metal heat conductor or spreader is attached. The presence of the metal heat conductor on the backside of the flip chip ICs allows for a better thermal path to remove heat from the ICs relative to the substrate. The improved thermal path reduces the likelihood of damage to the ICs or delamination of the module. Various methods are proposed to construct the backside metal systems of the present disclosure. Additionally, various capture features may be used to assist in structural integrity.

The evolution of computing devices has caused multiple chips or ICs to be produced and assembled into multichip modules. Where these multichip modules are used for high-power applications such as power amplifier modules for radio frequency (RF) transmissions (e.g., in cellular infrastructure compliant with the fifth generation (5G) cellular standards), substantial heat may be generated within the ICs. In traditional wire-bonded devices, the chips would be attached to a lead frame, a metal structure that could shed heat. More recently, the lead frame has been replaced with flip chip-positioned chips on an organic laminate that allows, among other reasons, easier interchip routing, better integration of multiple chips, reduced electromagnetic interference (EMI) concerns, and easier mounting of more chips. However, the organic laminates are not good thermal conductors and may not be adequate to dissipate the heat generated in the ICs. In extreme cases, the thermal cycling caused by these chips may lead to device degradation, which, in turn, may lead to performance degradation.

Exemplary aspects of the present disclosure provide a new thermal path to draw heat from the chips in a multichip module before sufficient heat accumulation can cause damage to the device. A first exemplary structure that employs a continuous backside metal layer in contact with multiple chips on a multichip module is provided with reference to FIG. 1, and a second exemplary structure that provides discrete metal elements over respective ones of multiple chips and a continuous backside metal layer in contact with the multiple discrete metal elements is provided with reference to FIG. 2. After discussing these structures, several methods of making the structures, along with structural variations, are provided.

In this regard, FIG. 1 is a cross-sectional elevational view of a multichip package or module 100 having a plurality of chips or ICs 102(1)-102(N) and optionally one or more surface-mounted devices (SMDs) 104 (e.g., capacitors, inductors, or the like). The ICs 102(1)-102(N) are mounted on a substrate 106 in a flip chip style arrangement with conductors 108 (e.g., contacts, stud bumps, wires, a copper pillar with a solder cap, or the like) providing electrical connections between circuitry (not shown) within the ICs 102(1)-102(N) and metal interconnect layers and vias (also not shown) in the substrate 106. Likewise, conductors 110 may couple the SMD 104 to such metal interconnect layers and vias. In an exemplary aspect, the ICs 102(1)-102(N) may be devices formed from silicon carbide (SiC), gallium nitride (GaN), gallium arsenide (GaAs), or the like.

A high thermal sintered material 112(1)-112(N) (sometimes referred to in the industry or literature as high thermal conductivity sintered material, although the more generally used term is "high thermal sintered material") may be placed on a backside surface or die top 114(1)-114(N) of the ICs 102(1)-102(N). A metal layer 116 may thermally couple to the ICs 102(1)-102(N) through the high thermal sintered material 112(1)-112(N) and provide a thermal path 118 to draw heat from the ICs 102(1)-102(N). The metal layer 116 may be continuous between the different ones of the high thermal sintered material 112(1)-112(N) and may be configured to couple to a lead frame, chip carrier, or other system-level heat sinks (not shown). It should be appreciated that the thermal path 118 may be in an opposite direction compared to a signal path 120.

An underfill material 122 may be provided between ICs 102(1)-102(N) and the substrate 106 (e.g., in between the conductors 108). Likewise, a mold compound 124 may surround and cover the ICs 102(1)-102(N) as well as provide support and attachment surface area for the metal layer 116.

Figure 2:
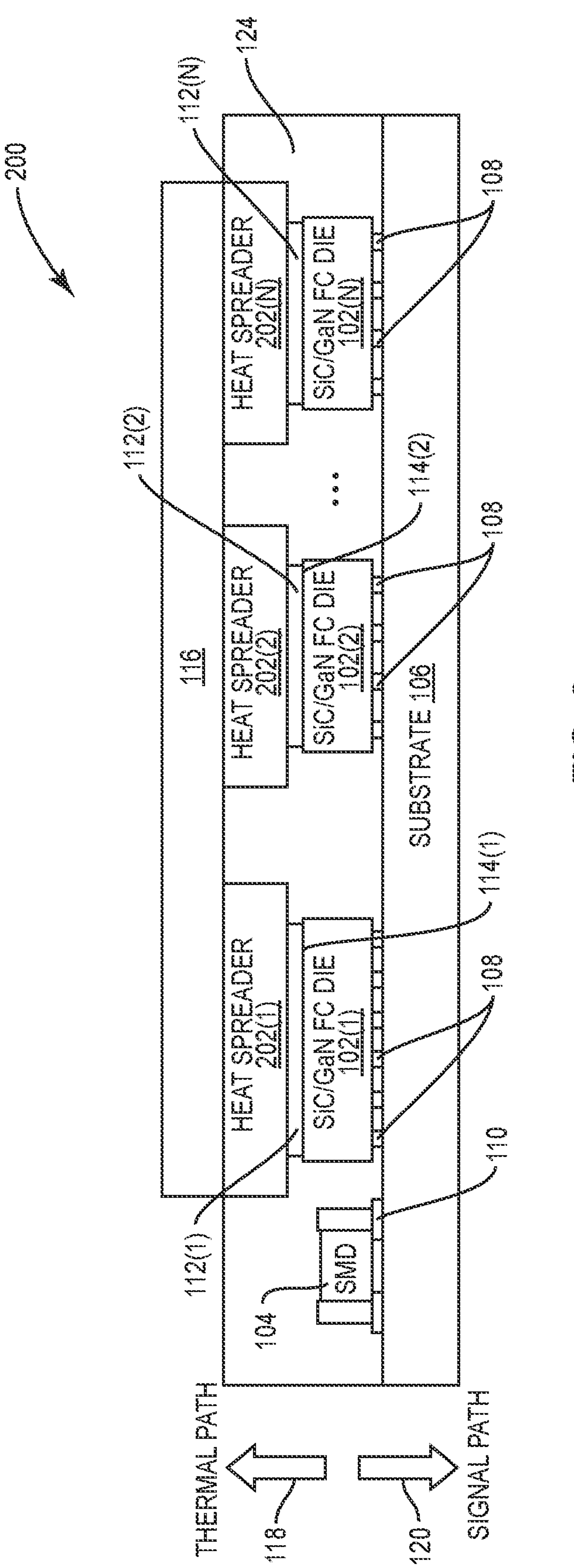
FIG. 2 is a cross-sectional side elevational view of a multichip module having a plurality of discrete metal elements coupled to a continuous backside metal system attached thereto.
Figure 8A:
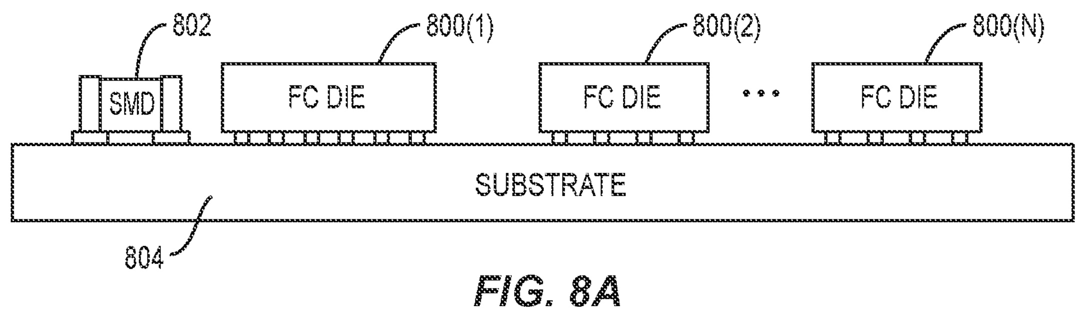
FIGS. 8A-8F are side elevational views of intermediate and finished products corresponding to the process of FIG. 7.
Figure 8B:
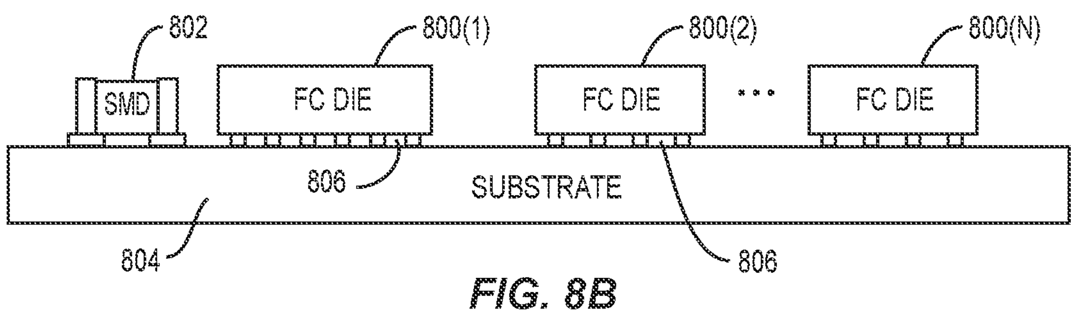
Figure 8C:
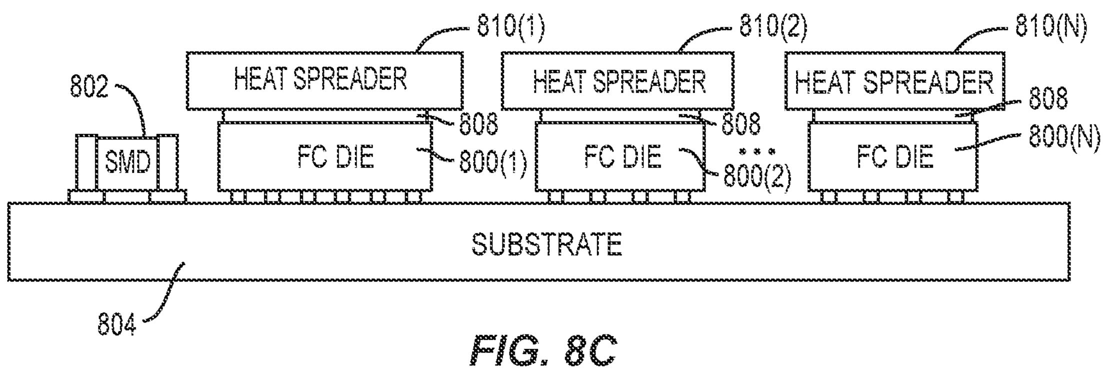
Figure 8D:
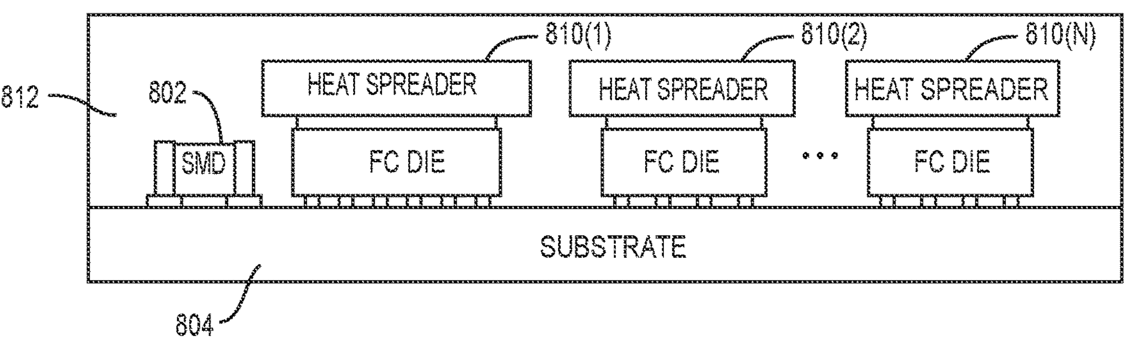
Figure 8E:
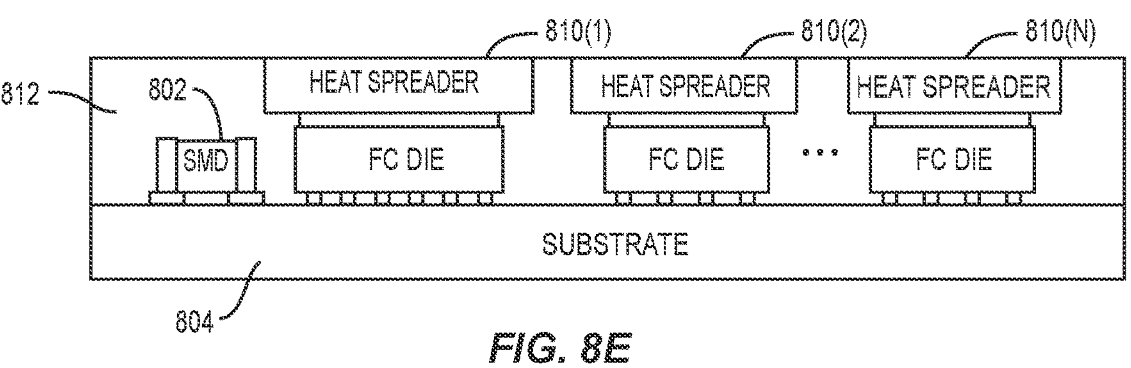
Figure 8F:
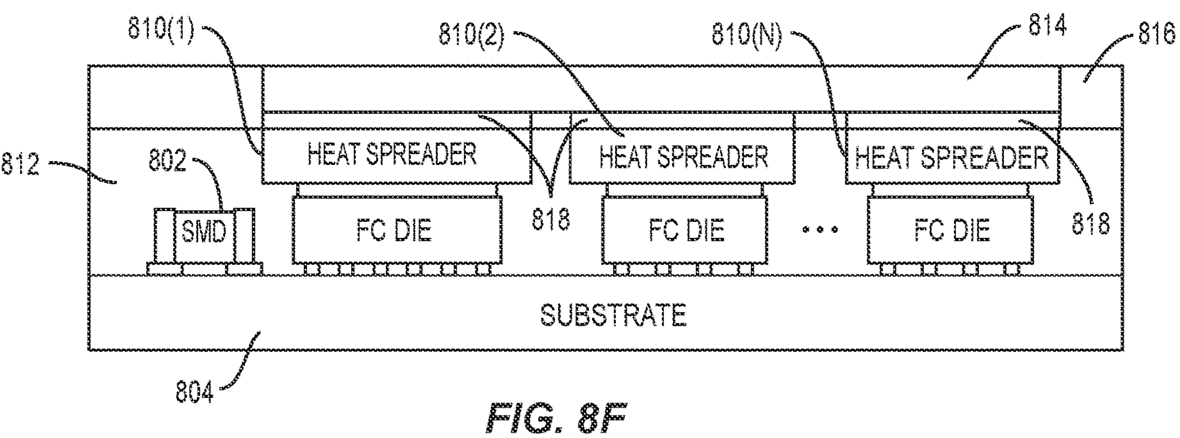

FIG. 2 illustrates a similar multichip package or module 200 with additional discrete heat spreader metal elements 202(1)-202(N) that are interposed between the high thermal sintered material 112(1)-112(N) and the metal layer 116. Elements that are the same between the modules 100 and 200 are numbered the same, and duplicative discussion is omitted. Note that an additional layer (better illustrated in FIG. 8F) of high thermal sintered material may be positioned between the discrete heat spreader metal elements 202(1)-202(N) and the metal layer 116.

Figure 3:
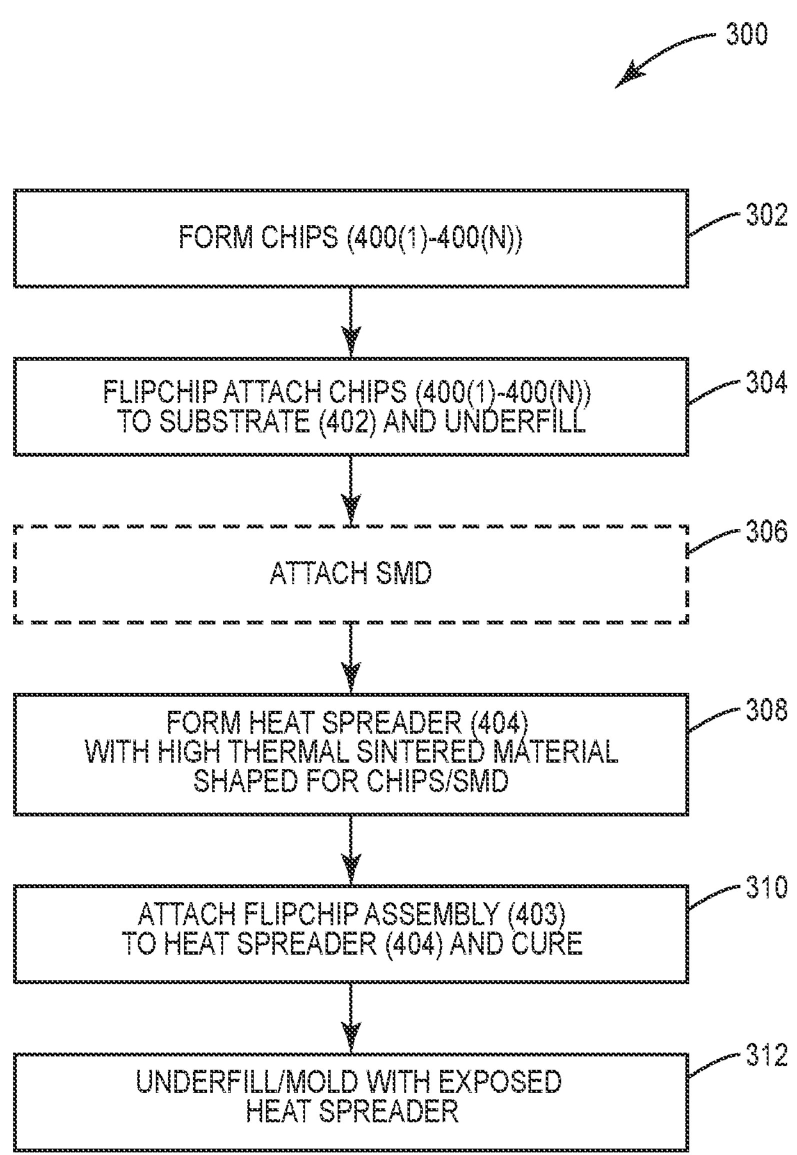
FIG. 3 is a flowchart illustrating a first exemplary process for forming a first multichip module having a continuous backside metal system attached thereto.

FIG. 3 provides a flowchart of a process 300 for making a multichip module according to exemplary aspects of the present disclosure. The process 300 begins with the formation of chips 400(1)-400(N) (block 302, see also FIG. 4A). The chips 400(1)-400(N) are attached in a flip chip fashion to a substrate 402, and an underfill is created (block 304) between the chips 400(1)-400(N) and the substrate 402 to form a flip chip assembly 403 (again see also FIG. 4A). Optionally, one or more SMDs may be attached (block 306). Note that the SMDs may be attached to the substrate 402 concurrently with the attachment of the chips (e.g., before the underfill).

In a parallel process that may take place before, concurrently, or subsequently to the creation of the flip chip assembly 403, a heat spreader 404 is formed with a high thermal sintered material 406 in cavities shaped for the chips 400(1)-400(N) (and optionally the SMD) (block 308, see also FIG. 4B). The heat spreader 404 may be a metal or other highly thermally-conductive material.

The process 300 continues by attaching the flip chip assembly 403 to the heat spreader 404 and curing (block 310, see also FIG. 4C) to form assembly 408. A mold 410 with underfill is applied with the heat spreader 404 exposed (block 312, see FIG. 4D) to form module 412. The underfill may be mold underfill or chip underfill as appropriate.

Figure 5:
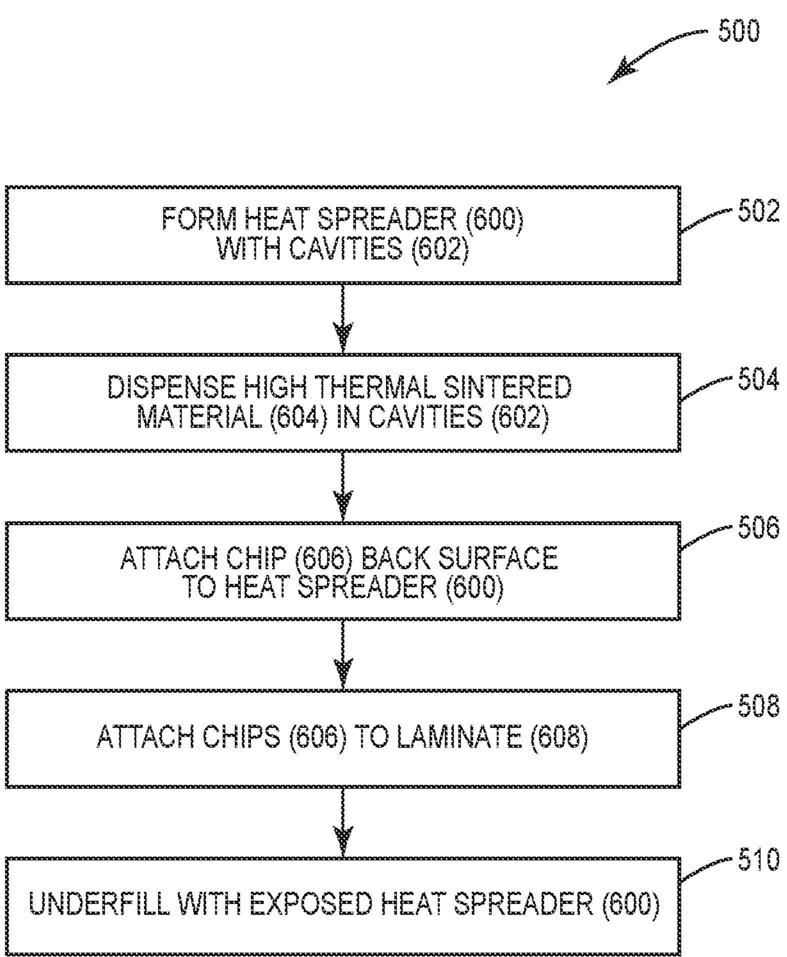
FIG. 5 is a flowchart illustrating a first exemplary process for forming a second multichip module having a continuous backside metal system attached thereto.
Figure 6E:
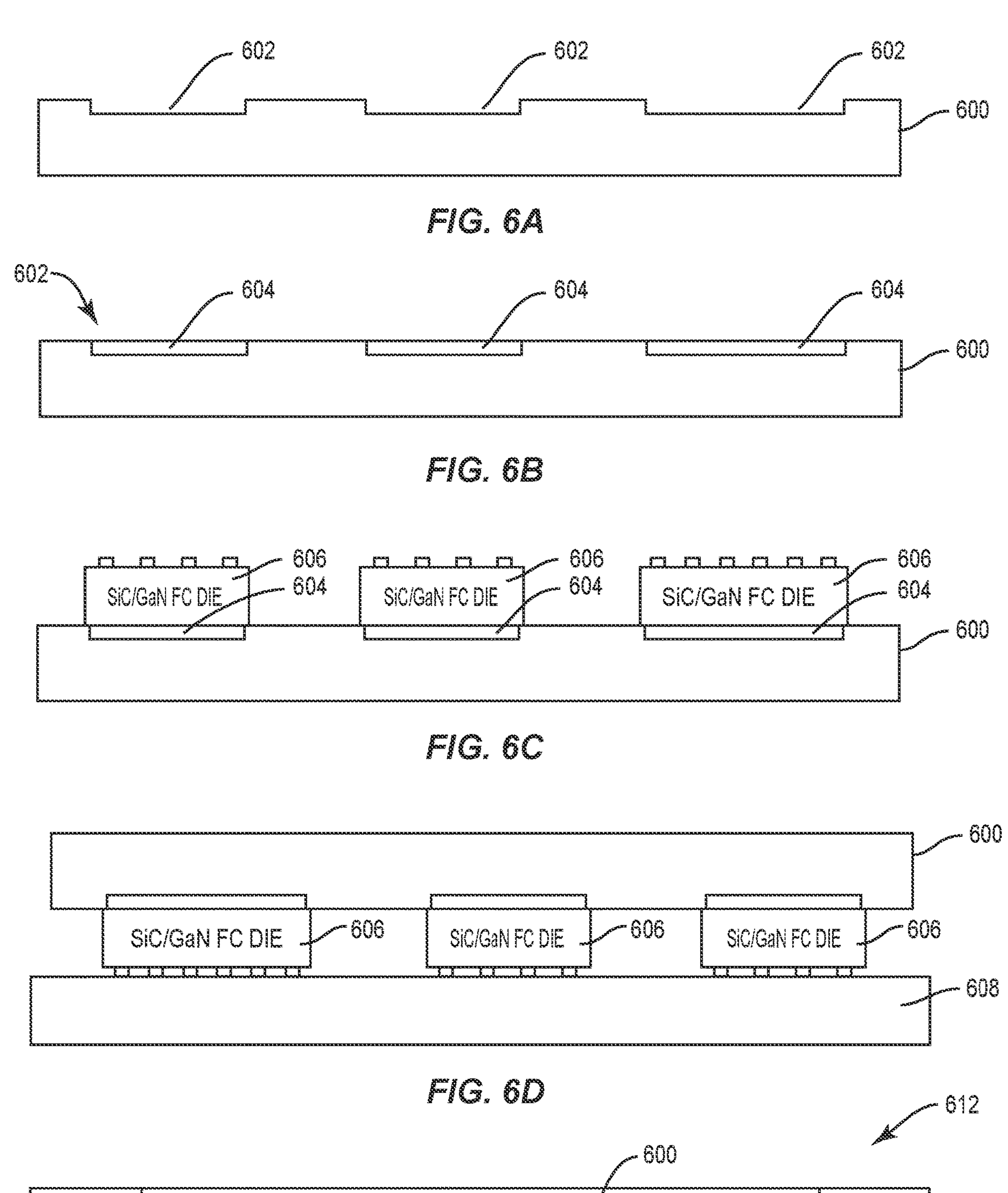

Instead of attaching an assembled flip chip assembly 403 to the heat spreader 404, an alternate process 500 builds a module from the heat spreader up, as shown by FIG. 5 and associated FIGS. 6A-6E. In this regard, the process 500 begins by forming a heat spreader 600 with cavities 602 (block 502, see FIG. 6A). High thermal sintered material 604 is then dispensed into the cavities 602 (block 504, see FIG. 6B). Chips 606 are formed, and a back surface of each chip 606 is attached to the heat spreader 600 (block 506, see FIG. 6C) and specifically attached to the high thermal sintered material 604. The chips 606 are then attached to a laminate 608 (block 508, see FIG. 6D). Note that the laminate 608 may also be equivalent to a substrate such as the substrate 402 of FIGS. 4A-4D. A mold material 610 is then used to encapsulate and underfill while leaving a surface of the heat spreader 600 exposed (block 510, see FIG. 6E) to form a module 612. Note that the primary difference between the module 412 and the module 612 is whether the mold material encloses the substrate (module 412) or the heat spreader (module 612). Designers may choose either structure based on other design criteria.

Figure 7:
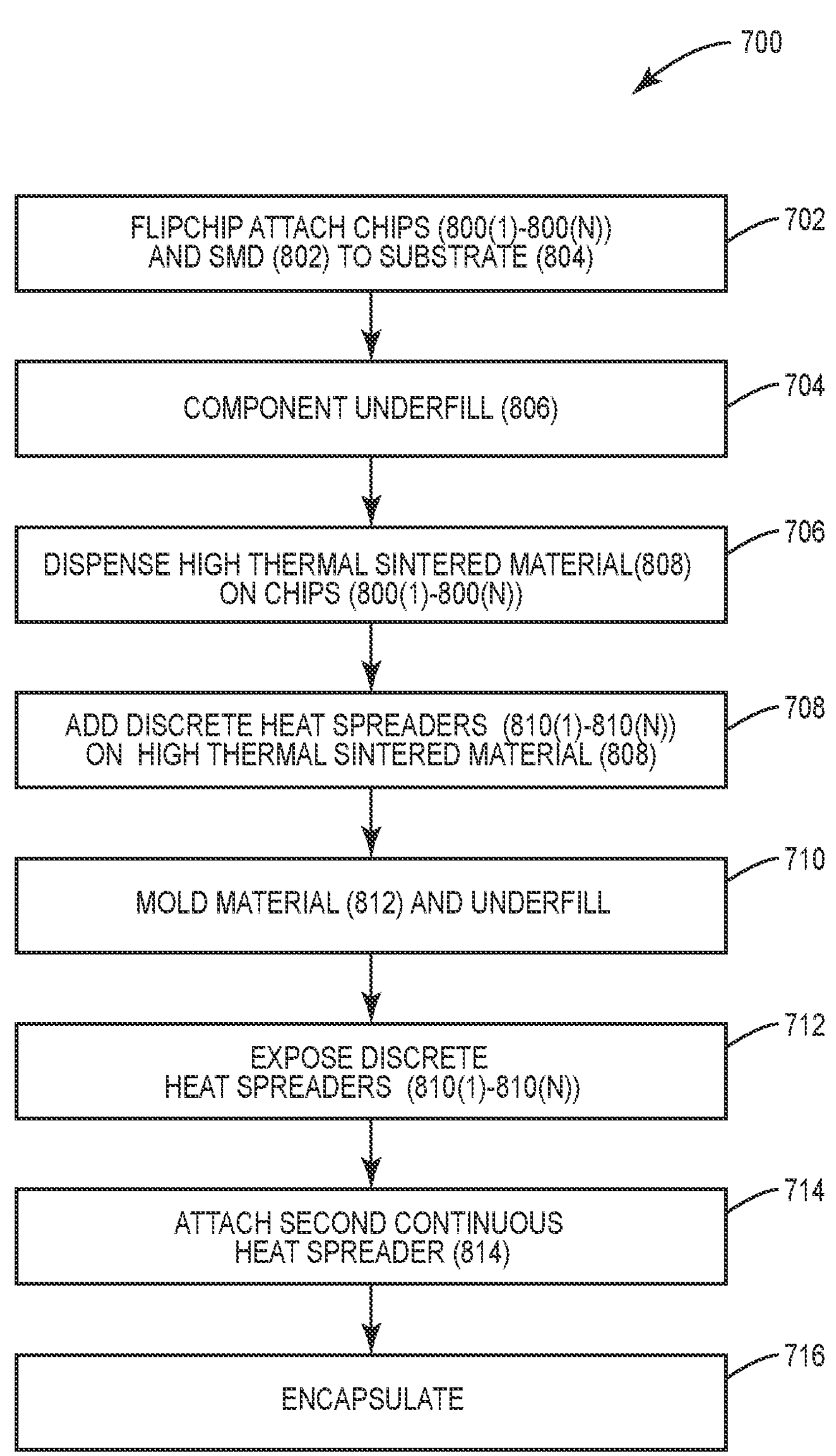
FIG. 7 is a flowchart illustrating a first exemplary process for forming a third multichip module having a continuous backside metal system attached thereto.

FIG. 7 provides a process 700 for making a module with discrete heat spreader elements, as discussed above in FIG. 2, with intermediate assembly stages illustrated in FIGS. 8A-8F. In this regard, the process 700 begins by forming chips 800(1)-800(N) and flip chip attaching the chips 800(1)-800(N) and optionally one or more SMDs 802 to a substrate 804 (block 702, see FIG. 8A). A chip or component underfill 806 is formed (block 704, see FIG. 8B). High thermal sintered material 808 is dispensed on the chips 800(1)-800(N) (block 706, see FIG. 8C), and discrete heat spreaders 810(1)-810(N) are added on the high thermal sintered material 808 (block 708, see FIG. 8C).

The process 700 continues by applying a mold material 812 to underfill (block 710, see FIG. 8D) the chips 800(1)-800(N) (chip underfill (CUF) and mold underfill (MUF)). The discrete heat spreaders 810(1)-810(N) are then exposed (block 712, see FIG. 8E), such as by back grinding. A second continuous heat spreader 814 is attached (block 714, see FIG. 8F), which extends across and thermally connects each of the discrete heat spreaders 810(1)-810(N). A second mold material 816 is applied to encapsulate the second continuous heat spreader 814 (block 716, see FIG. 8F) while leaving an exposed surface. A high thermal sintered material 818 may attach the second continuous heat spreader 814 to the discrete heat spreaders 810(1)-810(N).

Figure 9:
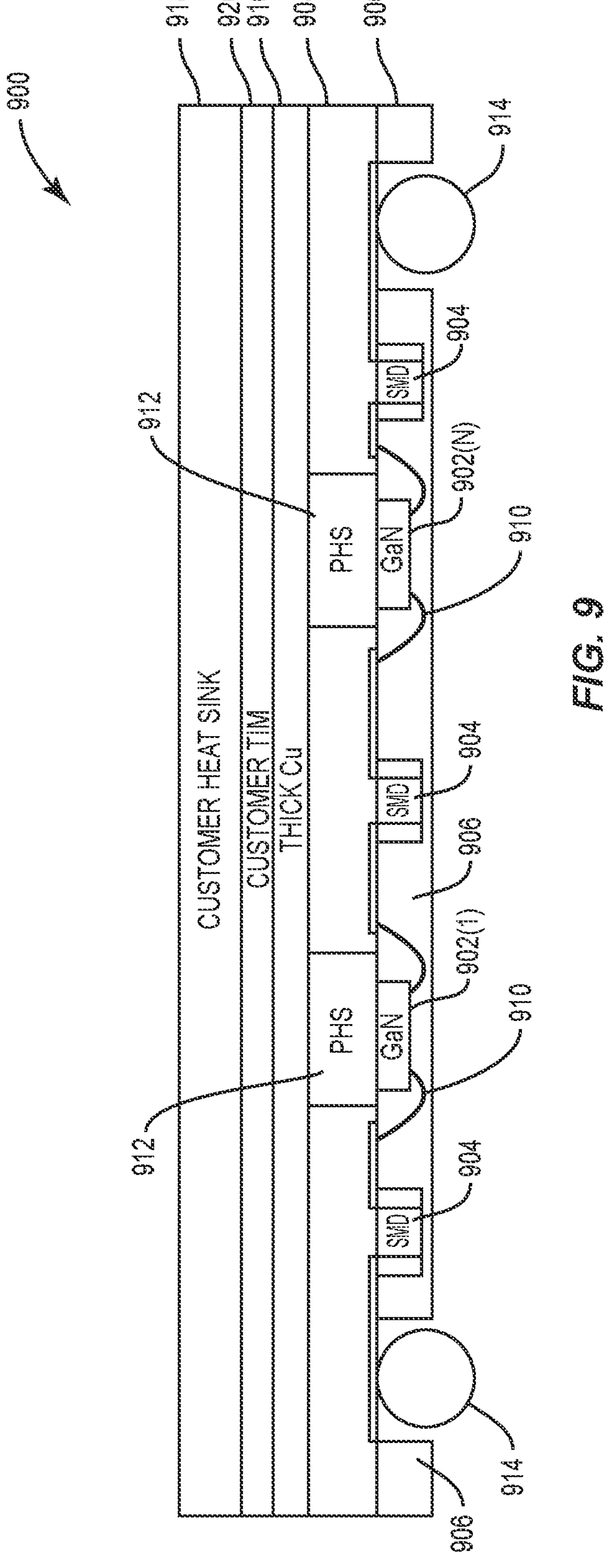
FIG. 9 is a side elevational view of a multichip module with wire bonds instead of a flip chip arrangement.

While the above discussion focuses on the applicability of the heat spreader to flip chip arrangements, the present disclosure is not so limited, and exemplary aspects include a wire bond arrangement, as better illustrated in FIG. 9. Specifically, a module 900 may include one or more chips 902(1)-902(N) and SMDs 904 encapsulated by a mold material 906 underneath a substrate 908. Wires 910 may couple the chips 902(1)-902(N) to conductive pads (not shown) and metal pillars 912 (e.g., plated metal) within the substrate 908. Balls 914 (e.g., a ball grid array (BGA)) may couple the module 900 to a chip carrier (not shown) or the like. A first metal plate 916 may be present on a backside of the substrate 908 and coupled to one or more metal pillars 912. According to the present disclosure, this first metal plate 916 may be a heat spreader and may be coupled to a second heat sink 918 through TIM 920.

While the above description leaves open the specific shape of the discrete heat spreader metal elements (e.g., metal elements 202(1)-202(N)), exemplary aspects of the present disclosure contemplate that the metal and/or the epoxy may be formed with capture features to improve structural integrity and reduce the chance of delamination. Where partial delamination does occur, the capture feature keeps the heat spreader in a position where the heat spreader may still function as a thermal conduit to assist in heat dissipation.

Figure 10:
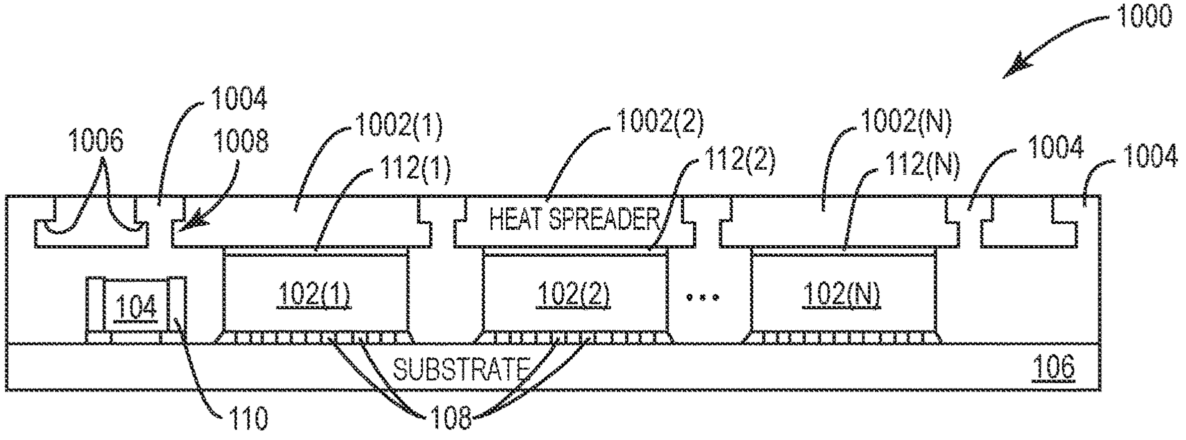
FIG. 10 is a cross-sectional view of a first aspect using T-shape capture features.

In this regard, FIGS. 10-13 illustrate various contemplated capture features. More specifically, FIG. 10 illustrates a module 1000 with inverted T-shaped metal elements 1002(1)-1002(N). While not shown in FIG. 10, it should be appreciated that metal elements 1002(1)-1002(N) may be formed from a continuous metal layer (see also FIG. 11B) with complementary T-shaped portions removed. Note that the epoxy 1004 may be formed or shaped to have a complementary shape relative to the metal elements 1002(1)-1002(N) (filling the portions removed from the continuous sheet) and include a shoulder 1006, which engages with a lip 1008 of the metal elements 1002(1)-1002(N).

Figure 11A:
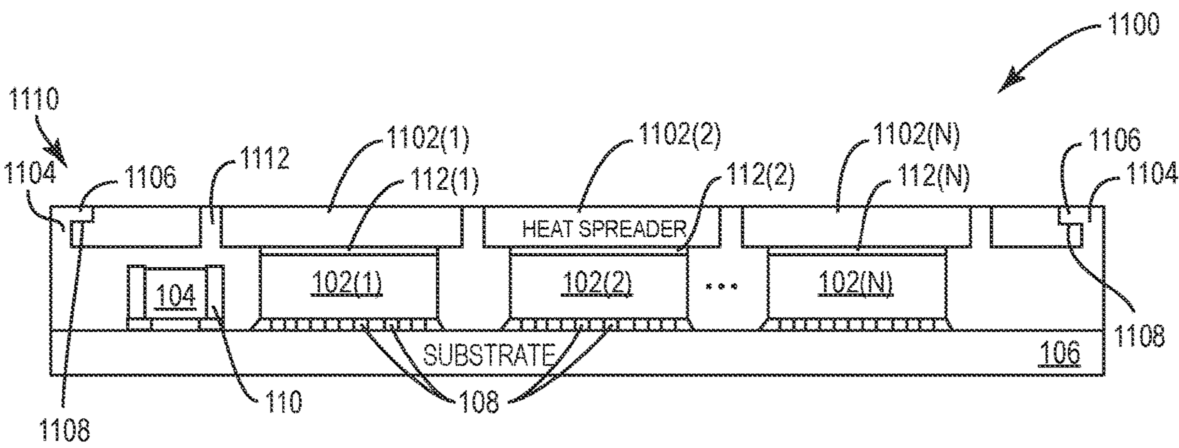
FIG. 11A is a lengthwise cross-sectional view of a second aspect using circular capture features.
Figure 11B:
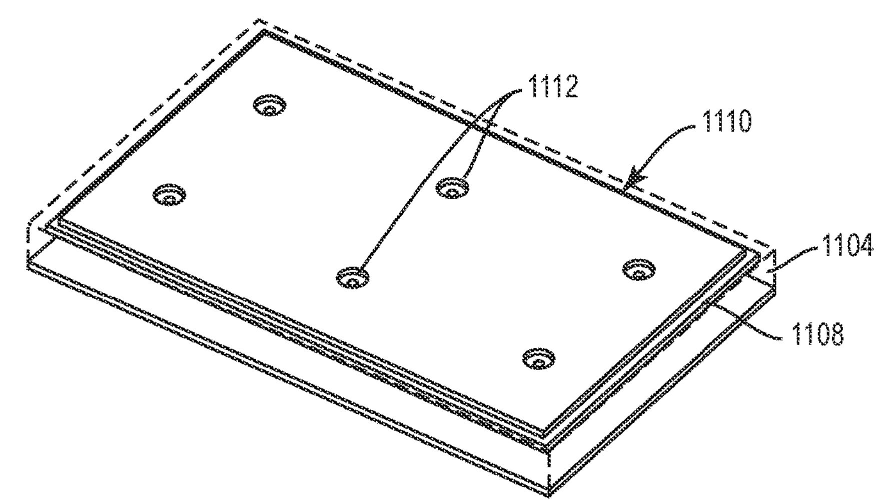
FIG. 11B is a side-top perspective view of the aspect of FIG. 11A.

FIG. 11A is similar, except that the capture elements that interact metal elements 1102(1)-1102(N) of the module 1100 may be only present at the periphery of the continuous sheet 1110 (better seen in FIG. 11B). Specifically, the epoxy 1104 may include a shoulder 1106 that engages the lip 1108 of the sheet 1110. Vertical cylinders 1112 may be present in the sheet 1110 to allow the epoxy 1104 to flow around the devices 102.

Figure 11C:
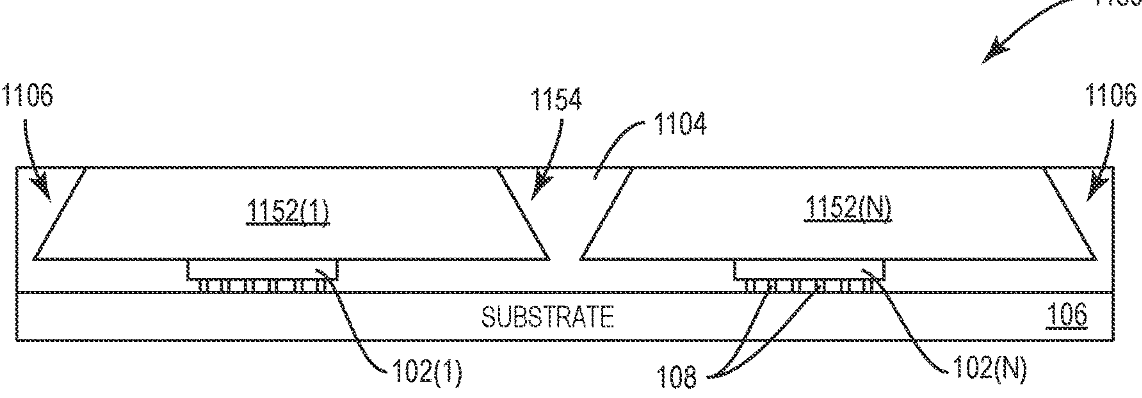
FIG. 11C is another cross-sectional view where sloped walls are used to create a capture feature.

While almost all the discussion above and the associated Figures contemplate rectilinear capture features, the present disclosure is not so limited. In this regard, FIG. 11C illustrates a module 1150 where the metal elements 1152(1)-1152(N) have sloped walls 1154, such that the epoxy 1104 forms a shoulder 1106 over the slope. This arrangement means that some portion of epoxy 1104 is on top of the metal elements 1152(1)-1152(N) helping hold the metal elements 1152(1)-1152(N) in place. Again, it should be appreciated that the metal elements 1152(1)-1152(N) may be part of a larger sheet with conical apertures formed therein so that the cross-sectional view of FIG. 11C is created.

Figure 12:
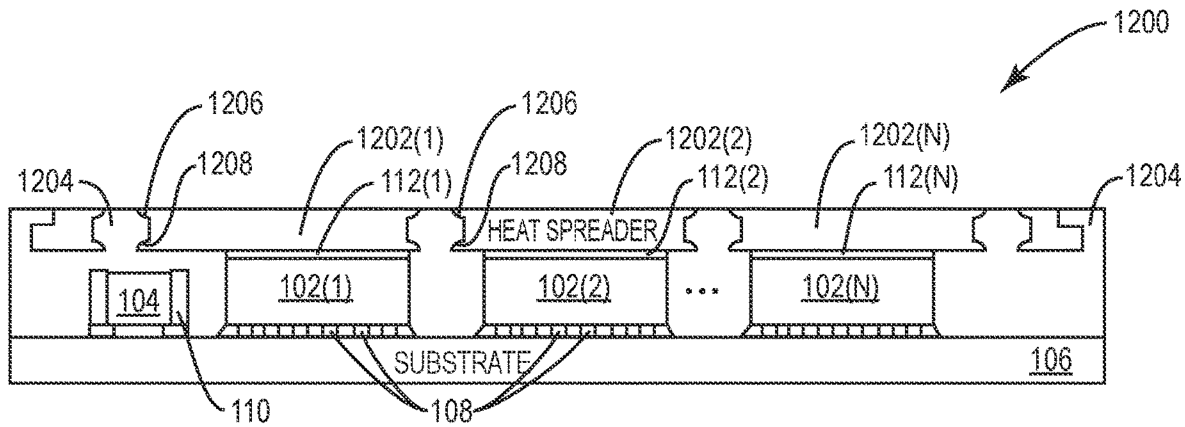
FIG. 12 is a cross-sectional view of a third aspect using octagonal capture features.

FIG. 12 is similar except that the metal elements 1202(1)-1202(N) of the module 1200 may be polygonal with more than four sides (e.g., pentagon, hexagon, heptagon, octagon (shown), or the like. While it is possible that these may be regular polygons, it is also possible that, as shown, they may be irregular with uneven sides. Again, the epoxy 1204 may have a complementary shape. In this aspect, a shoulder 1206 may engage a lip 1208 of the metal elements 1202(1)-1202(N). As with the other aspects, the metal elements 1202(1)-1202(N) may be formed from a continuous sheet with the polygonal apertures formed therein.

Figure 13:
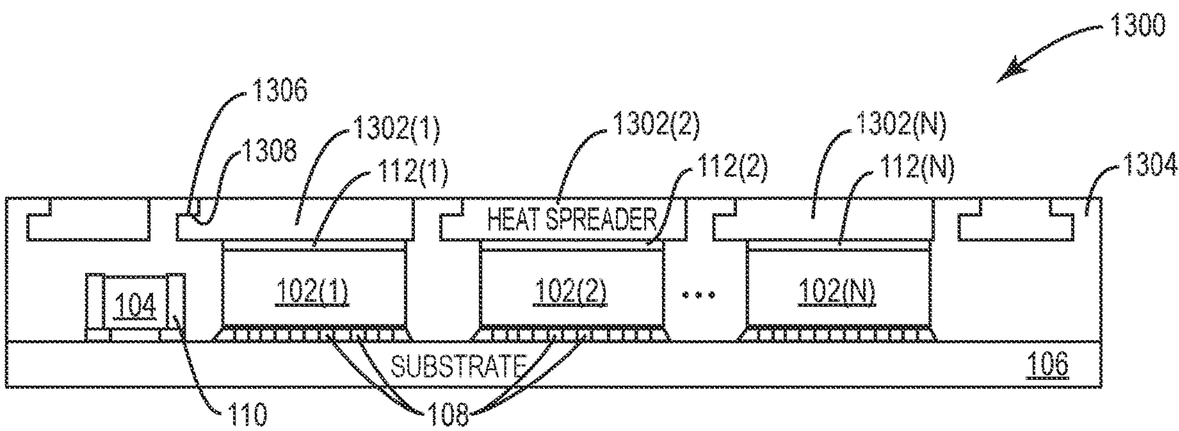
FIG. 13 is a cross-sectional view of a fourth aspect using L-shape capture features.

FIG. 13 is similar, except that the metal elements 1302(1)-1302(N) of the module 1300 may be L-shaped. Again, the epoxy 1304 may have a complementary inverted-L shape. In this aspect, a shoulder 1306 may engage a lip 1308 of the metal elements 1302(1)-1302(N).

Note also that while the above discussion may be directed towards cellular infrastructure or other larger fixed installation type devices, the teachings of the present disclosure may be applicable to other devices, including, but not limited to, desktop computers, tablets, phablets, and the like.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A multichip module comprising:

a substrate;

a plurality of chips coupled to the substrate; and a continuous heat spreader thermally coupled to each of the plurality of chips, wherein the continuous heat spreader delimits a plurality of cavities corresponding to the plurality of chips.

2. The multichip module of claim 1, further comprising at least one surface-mounted device (SMD) coupled to the substrate.

3. The multichip module of claim 1, wherein each of the plurality of chips is coupled to the substrate through wire bonds.

4. The multichip module of claim 3, further comprising a metal pillar extending through the substrate from a chip to the continuous heat spreader.

5. The multichip module of claim 3, further comprising a ball coupled to the substrate.

6. The multichip module of claim 1, wherein each of the plurality of chips is coupled to the substrate through a flip chip coupling where a first side is coupled to the substrate.

7. The multichip module of claim 6, wherein each of the plurality of chips has a second side opposite the first side, and the second side is coupled to the continuous heat spreader.

8. The multichip module of claim 6, wherein each of the plurality of chips has a second side, and the second side is coupled to the continuous heat spreader through an intermediate discrete heat spreader.

9. The multichip module of claim 8, wherein the intermediate discrete heat spreader comprises a capture element.

10. The multichip module of claim 9, wherein the capture element comprises a shape selected from the group consisting of a T-shape, an L-shape, and a polygon with five or more sides.

11. The multichip module of claim 6, further comprising a mold material encapsulating the plurality of chips.

12. The multichip module of claim 11, wherein the mold material encapsulates the continuous heat spreader while leaving an exposed surface.

13. The multichip module of claim 11, wherein the mold material encapsulates the substrate.

14. The multichip module of claim 1, wherein the continuous heat spreader comprises a metal.

15. The multichip module of claim 1, further comprising a sintered material coupling at least one of the plurality of chips to the continuous heat spreader.

16. The multichip module of claim 1, further comprising a sintered material disposed in each of the plurality of cavities.

17. The multichip module of claim 1, wherein at least one of the plurality of chips comprises a die made from silicon carbide (SiC) or gallium nitride (GaN).

18. A method of forming a multichip module, comprising:

forming a plurality of chips;

forming a heat spreader with a plurality of cavities corresponding to the plurality of chips; and attaching the plurality of chips to the heat spreader.

19. A method of forming a multichip module, comprising:

forming a heat spreader with a plurality of cavities;

dispensing a high thermal sintered material into the plurality of cavities;

attaching a plurality of chips to the heat spreader at the plurality of cavities; and attaching the plurality of chips to a laminate.

* * * * *